(12) United States Patent
Bergendahl et al.

(10) Patent No.: US 10,014,391 B2
(45) Date of Patent: *Jul. 3, 2018

(54) VERTICAL TRANSPORT FIELD EFFECT TRANSISTOR WITH PRECISE GATE LENGTH DEFINITION

(71) Applicant: International Business Machines Corporation, Armonk, NY (US)

(72) Inventors: Marc A. Bergendahl, Troy, NY (US); Kangguo Cheng, Schenectady, NY (US); Fee Li Lie, Albany, NY (US); Eric R. Miller, Schenectady, NY (US); John R. Sporre, Albany, NY (US); Sean Teehan, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/195,332

(22) Filed: Jun. 28, 2016

(65) Prior Publication Data
US 2017/0373166 A1   Dec. 28, 2017

(51) Int. Cl.
| | | |
|---|---|---|
| *H01L 21/336* | (2006.01) | |
| *H01L 29/66* | (2006.01) | |
| *H01L 29/78* | (2006.01) | |
| *H01L 29/06* | (2006.01) | |
| *H01L 21/308* | (2006.01) | |

(52) U.S. Cl.
CPC ...... *H01L 29/6656* (2013.01); *H01L 21/3085* (2013.01); *H01L 29/0649* (2013.01); *H01L 29/66795* (2013.01); *H01L 29/785* (2013.01)

(58) Field of Classification Search
CPC .................................................. H01L 21/82345
USPC .................................................. 438/284, 596
See application file for complete search history.

(56) References Cited

U.S. PATENT DOCUMENTS

| | | | |
|---|---|---|---|
| 7,446,025 B2 | 11/2008 | Cohen et al. | |
| 7,723,768 B2 | 5/2010 | Suh | |
| 8,124,483 B2* | 2/2012 | Schulz | H01L 29/66795 |
| | | | 438/283 |
| 8,445,334 B1 | 5/2013 | Basker et al. | |
| 8,653,584 B2 | 2/2014 | Renn | |
| 8,987,100 B2* | 3/2015 | Oh | H01L 29/66477 |
| | | | 438/299 |
| 9,087,897 B1 | 7/2015 | Anderson et al. | |
| 9,190,494 B2* | 11/2015 | Juengling | H01L 21/82343 |
| 9,229,835 B2 | 1/2016 | Li et al. | |
| 9,735,246 B1* | 8/2017 | Basker | H01L 29/42392 |
| 9,812,567 B1* | 11/2017 | Basker | H01L 21/3081 |

(Continued)

OTHER PUBLICATIONS

Anderson, B. A., et al; "Variable Gate Lengths for Vertical Transistors"; U.S. Appl. No. 14/970,624, filed Dec. 16, 2015.

(Continued)

*Primary Examiner* — Chandra Chaudhari
(74) *Attorney, Agent, or Firm* — Cantor Colburn LLP; Vazken Alexanian

(57) ABSTRACT

Techniques relate to a gate stack for a semiconductor device. A vertical fin is formed on a substrate. The vertical fin has an upper portion and a bottom portion. The upper portion of the vertical fin has a recessed portion on sides of the upper portion. A gate stack is formed in the recessed portion of the upper portion of the vertical fin.

10 Claims, 9 Drawing Sheets

(56) References Cited

U.S. PATENT DOCUMENTS

2008/0157225 A1   7/2008  Datta et al.
2009/0057780 A1   3/2009  Wong et al.
2010/0065941 A1   3/2010  Wells et al.

OTHER PUBLICATIONS

Anderson, B. A., et al; "Vertical Transistor Fabrication and Devices"; U.S. Appl. No. 14/975,168, filed Dec. 18, 2015.
Cheng, Kangguo, et al.; "Fabrication of Vertical Field Effect Transistor Structure with Controlled Gate Length"; U.S. Appl. No. 15/087,074, filed Mar. 31, 2016.
List of IBM Patents or Patent Applications Treated as Related; (Appendix P), Filed Jun. 16, 2017; 2 pages.
Marc A. Bergendahl et al., "Vertical Transport Field Effect Transistor With Precise Gate Length Definition", U.S. Appl. No. 15/622,769, dated Jun. 14, 2017.

* cited by examiner

FIG. 9

FORM A VERTICAL FIN ON A SUBSTRATE, THE VERTICAL FIN HAVING AN UPPER PORTION AND A BOTTOM PORTION, WHEREIN THE UPPER PORTION OF THE VERTICAL FIN HAS A RECESSED PORTION ON SIDES OF THE UPPER PORTION 905

FORM A GATE STACK IN THE RECESSED PORTION OF THE UPPER PORTION OF THE VERTICAL FIN 910

VERTICAL TRANSPORT FIELD EFFECT TRANSISTOR WITH PRECISE GATE LENGTH DEFINITION

BACKGROUND

The present invention relates to semiconductors, and more specifically, to vertical transport field effect transistors (FET) with precise gate length definition.

A metal-oxide-semiconductor field-effect transistor (MOSFET) is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on"). A fin type field effect transistor (FET) is a type of MOSFET. FinFET devices include an arrangement of fins disposed on a substrate. The fins are formed from a semiconductor material. A gate stack is arranged over the fins and defines a channel region of the fins, while regions of the fins extending outwardly from the channel region define active source and drain regions of the device. Various state-of-the-art techniques may be used for forming the fin.

One type of finFET is a vertical finFET. A vertical finFET operates like a normal finFET that is horizontal. However, the source and drain regions are positioned vertically with respect to the fin such that the current runs vertically from source to drain. Also, the gate usually wraps around the fin.

SUMMARY

According to one or more embodiments, a gate stack for a semiconductor device is provided. The semiconductor device includes a vertical fin formed on a substrate, and the vertical fin has an upper portion and a bottom portion. The upper portion of the vertical fin has a recessed portion on sides of the upper portion. Also, the semiconductor device includes a gate stack formed in the recessed portion of the upper portion of the vertical fin.

According to one or more embodiments, a method of forming a gate stack for a semiconductor device. The method including forming a vertical fin on a substrate, in which the vertical fin has an upper portion and a bottom portion. The upper portion of the vertical fin has a recessed portion on sides of the upper portion. Also, the method includes forming a gate stack in the recessed portion of the upper portion of the vertical fin.

According to one or more embodiments, a method of forming a gate stack for a semiconductor device is provided. The method includes forming a vertical fin on a substrate, in which the vertical fin has an upper portion and a bottom portion. The method includes forming a recessed portion in the upper portion of the vertical fin such that the recessed portion is on sides of the upper portion, and forming a gate stack in the recessed portion of the upper portion of the vertical fin. A gate length is predefined by the recess portion.

BRIEF DESCRIPTION OF THE DRAWINGS

FIG. 9 is flow chart of a method of forming a gate stack for a semiconductor device according to one or more embodiments.

DETAILED DESCRIPTION

Figure 1:
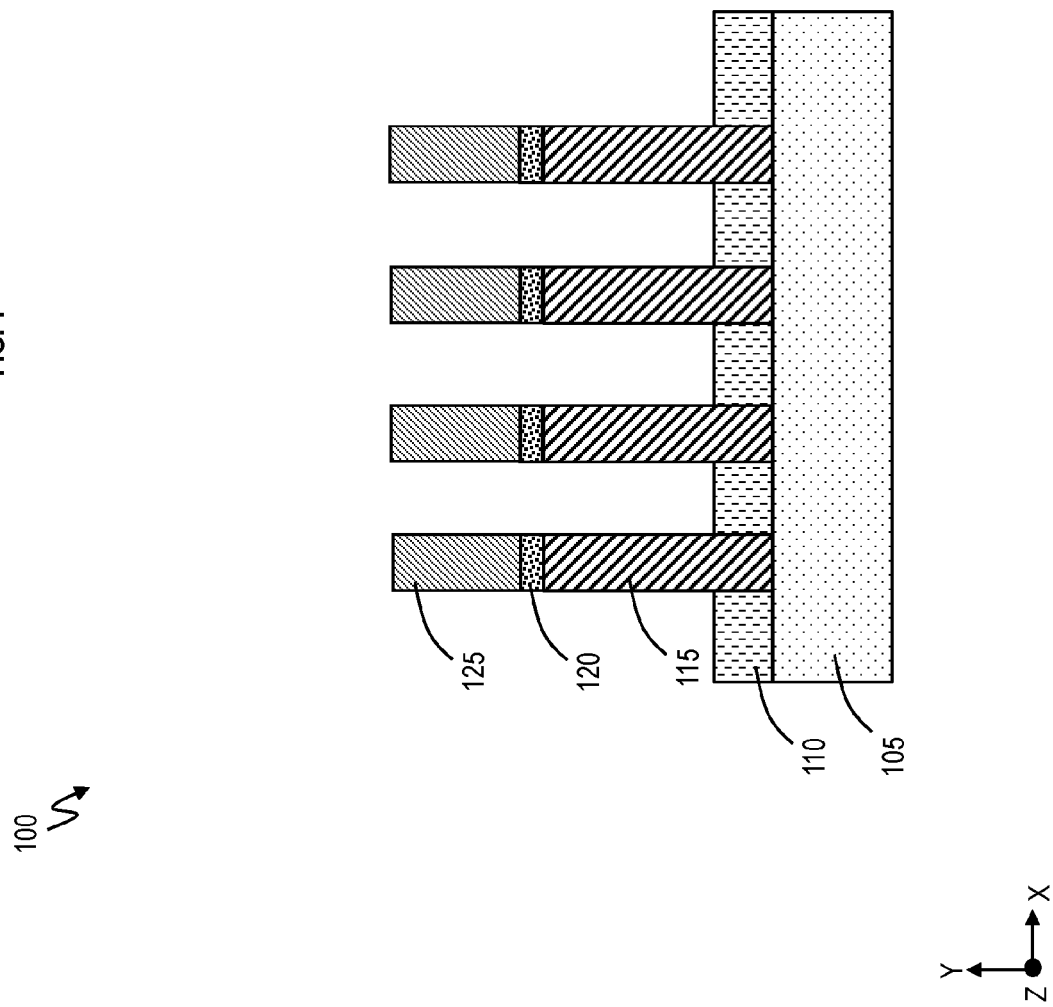
FIG. 1 is a cross-sectional view of a structure according to one or more embodiments.

Various embodiments are described herein with reference to the related drawings. Alternative embodiments may be devised without departing from the scope of this document. It is noted that various connections and positional relationships (e.g., over, below, adjacent, etc.) are set forth between elements in the following description and in the drawings. These connections and/or positional relationships, unless specified otherwise, may be direct or indirect, and are not intended to be limiting in this respect. Accordingly, a coupling of entities may refer to either a direct or an indirect coupling, and a positional relationship between entities may be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

A vertical fin field effect transistor (or vertical finFET) may be referred to as a vertical transport field effect transistor because the hole or electron current flows in the vertical direction.

The state-of-the-art vertical finFET process flow involves forming a fin structure with a hard mask, depositing high-k material/work function metal (WFM) around that fin structure, vertically recessing the hard mask, high-k material, and work function metal to form the gate height, then depositing the gate metal, and recessing the gate metal to the same height. The net determinator of the final gate height is based on a series of timed recesses that may or may not be uniform across the wafer. In addition, the timed recesses cannot be end pointed, which can result in great process variability, including center to edge deltas, height variations, and isolated/dense loading.

One or more embodiments address the issue of timed-recess variation difference by utilizing a fin undercut, and the resulting hard mask overhang, to strictly define the gate height. The fin undercut causes an indention which is a laterally recessed portion in the fin. The gate height is the gate length (L) for the vertical FET. The fin structure is formed with a bottom spacer between the fins, and each fin has an equal width hard mask on top. In forming the indention, the fin is recessed using either wets or an isotropic selective etch, to a depth that is equal to the desired final thickness (in the width direction) of the high-k material, WFM, and gate metal. After the deposition of these three materials, the fin hard mask overhang protects the gate materials (which are a gate stack of the high-k material, WFM, and gate metal) from being etched during an anisotropic gate recess. This allows the width of the gate, as well as the gate length, to be defined by one process (i.e., fin undercut that creates the indention) in the one or more embodiments, as opposed to multiple recesses in the state-of-the-art. This also differs from the current process of record (POR) approach in the state-of-the-art that uses an additional spacer to define the gate width, but requires a prior well-timed Tungsten recess.

Now turning to the figures, FIGS. 1-8 illustrate a process flow of fabricating a gate stack, which may also be referred to as a gate, in a semiconductor device according to one or more embodiments.

FIG. 1 is a cross-sectional view of a structure 100 according to one or more embodiments. The structure 100 is a semiconductor device, and the structure 100 may be a finFET device. An example fin structure is depicted in FIG. 1, and the fin structure may be formed using standard lithography processes. The structure 100 includes one or more fins 115 disposed on top of a substrate 105. Example materials of the substrate 105 may include silicon (Si), silicon germanium (SiGe), III-V semiconductors, etc. One or more portions of the substrate 105 under the fins 115 may be doped, for example, to form a source or drain. In one implementation, the fins 115 may be the same material as the substrate 105. Also, a portion or portions of the fins 115 may be doped as desired.

A bottom spacer 110 is formed on top of the substrate 105. The bottom spacer 110 may be a nitride, such as silicon nitride (SiN). Other example materials of the bottom spacer 110 may include an oxide (e.g., silicon oxide ($SiO_x$).

A first hard mask layer 120 may be formed on top of the fins 115. The first hard mask layer 120 may be an adhesion layer. An example material of the first hard mask layer 120 may be an oxide, such as, for example, silicon dioxide ($SiO_2$). Other example materials of the first hard mask layer 120 may include silicon nitride, metal nitride, metal oxide, etc.

A second hard mask layer 125 may be formed on top of the first hard mask layer 120. An example material of the second hard mask layer 125 may be a nitride, such as, for example, silicon nitride ($SiN_3$). Other example material of the second hard mask layer 125 may include oxide, metal nitride, metal oxide, etc.

Figure 2:
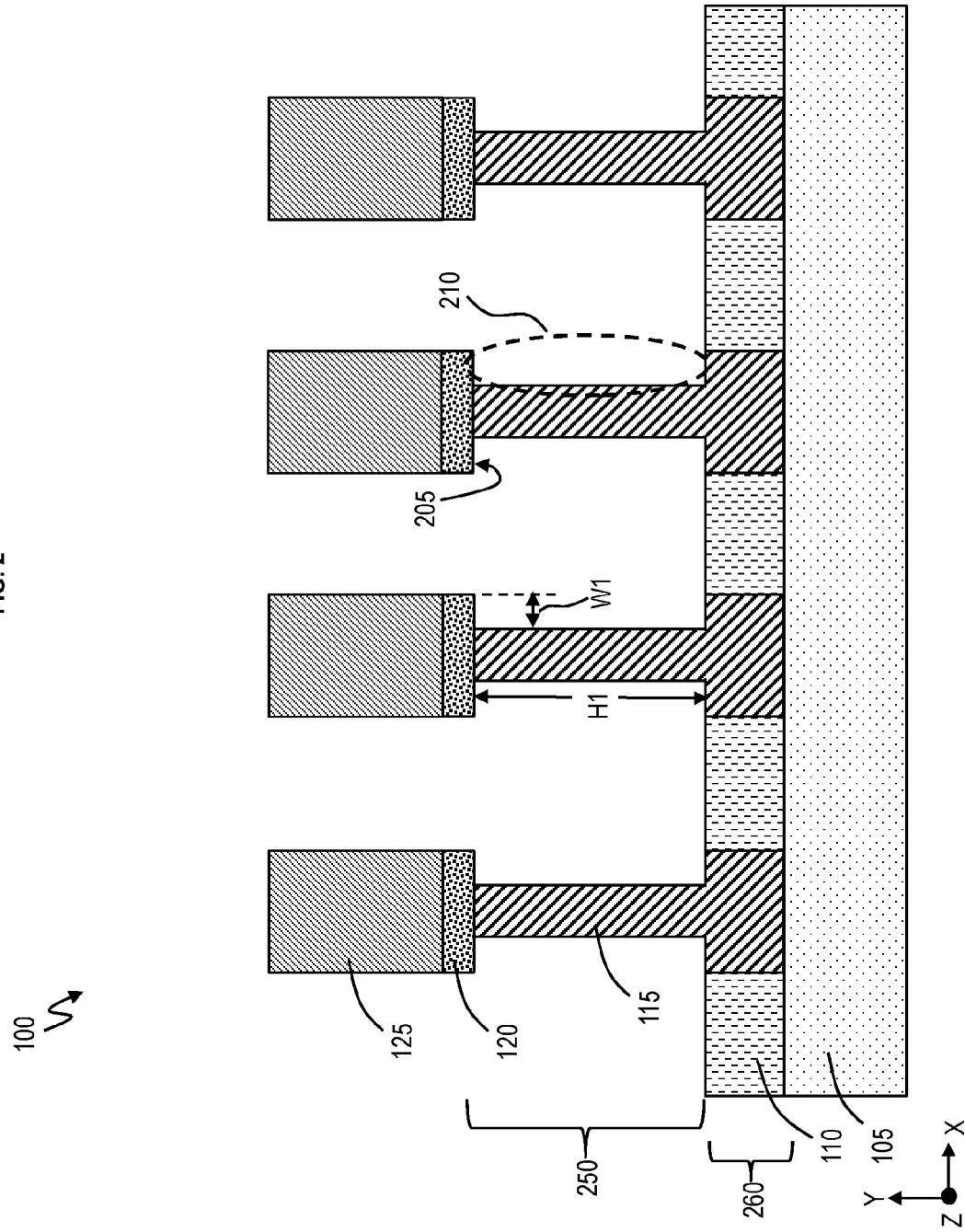
FIG. 2 is a cross-sectional view of the structure depicting a lateral recess of the fins according to one or more embodiments.

FIG. 2 is a cross-sectional view of the structure 100 depicting a lateral recess of the fins 115 according to one or more embodiments. The fin 115 is undercut with wets (i.e., a wet etchant), reactive ion etching (RIE), etc., below the first and second hard masks 120, 125 by an amount equal to the desired net thickness (in the x-axis) of the gate stack 610 (shown in FIG. 6) formed by the high-k/work function metal/metal gate. The desired net thickness of the high-k material, work function metal, and metal gate is predefined in advance. The fin 115 undercut results in hard mask overhang 205.

The fins 115 are laterally recessed on both sides in the x-axis, and this etching forms the indention/recess 210 on both sides of the fins 115. The indention or recess 210 is formed in an upper portion 250 of the fin 115. However, the lower portion 260 of the fin 115 is protected by the bottom spacer 110 and is not etched during the lateral recess. The depth of the indention/recess 210 on one side of the fin 115 is width W1 in the x-axis. An example etchant to form the indention/recess 210 may be chlorine, or hydrogen bromide based plasma, or a combination of an oxidizing standard clean 1 and hydrofluoric acid bath combination.

The net thickness of the gate stack 610, which is the same as the amount of undercut (resulting in hard mask overhang 205) on both sides of the fin 115, is twice the width W1 (i.e., 2·W1). An example range of the width W1 may be 1-10 nanometers (nm). The height H1 of the indention/recess in the y-axis may range from about 5-100 nm. The height H1 and width W1 of the indention/recess are formed by a single etching process. More particularly, this allows the width W1 of the gate stack 610 and the gate length L (discussed below) to be defined by one process, which is the fin undercut (corresponding to hard mask overhang 205) that creates the indention/recess 210 in the fins 115 in according with embodiments, as opposed to multiple recesses of the gate stack in the state-of-the-art.

Figure 3:
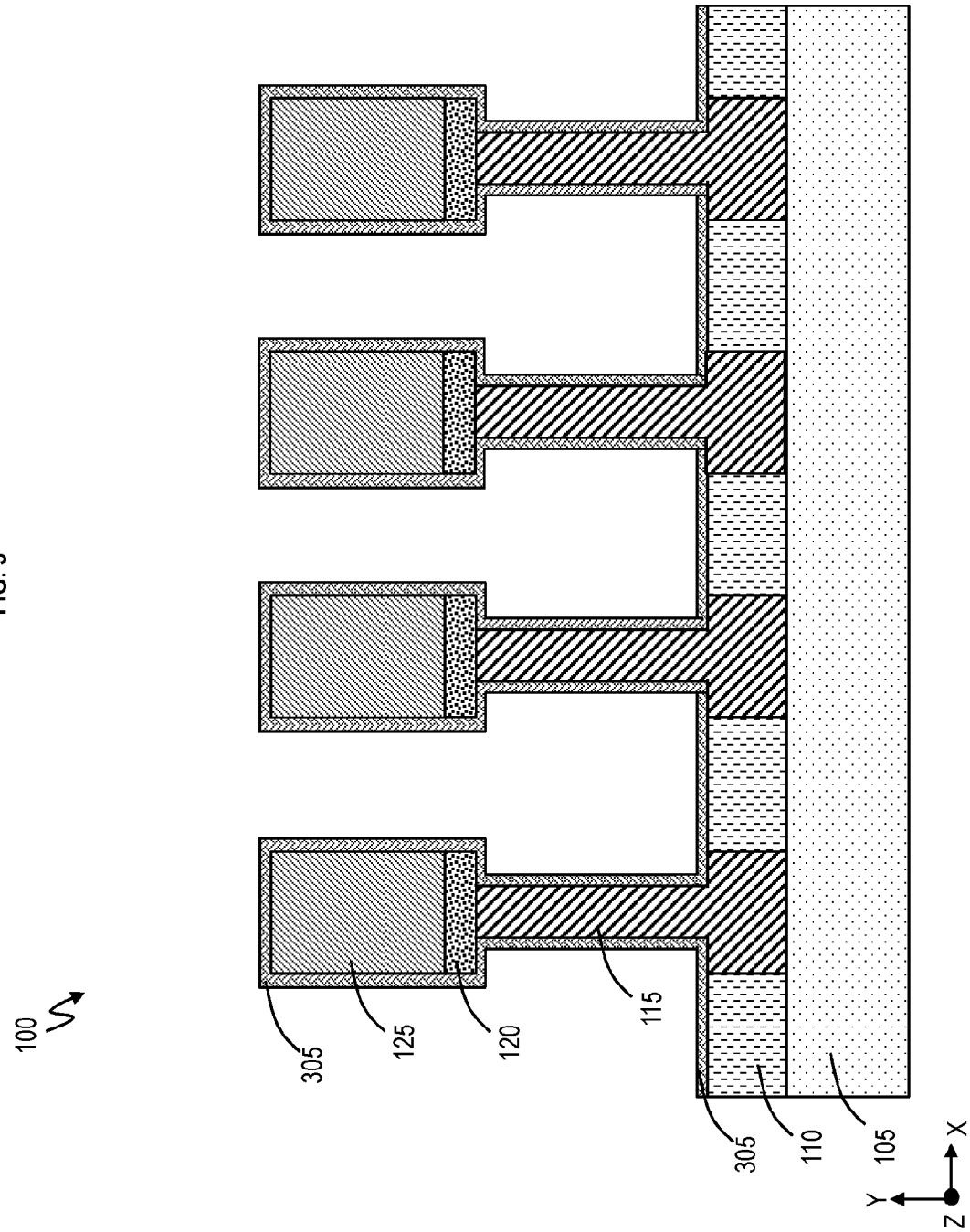
FIG. 3 is a cross-sectional view of the structure depicting deposition of a high-k material according to one or more embodiments.

FIG. 3 is a cross-sectional view of the structure 100 depicting deposition of a high-k material according to one or more embodiments. The high-k dielectric material 305 is formed on the bottom spacer 110, the fins 115 (including the indentions/recess 210), the first hard mask 120, and the second hard mask 125. The high-k dielectric material 305 is one part of the gate stack 610. In one implementation, example high-k dielectric materials may be dielectric materials having a dielectric constant k greater than silicon dioxide ($SiO_2$). For example, hafnium oxide ($HfO_2$) may be utilized as the high-k dielectric material in one implementation.

Figure 4:
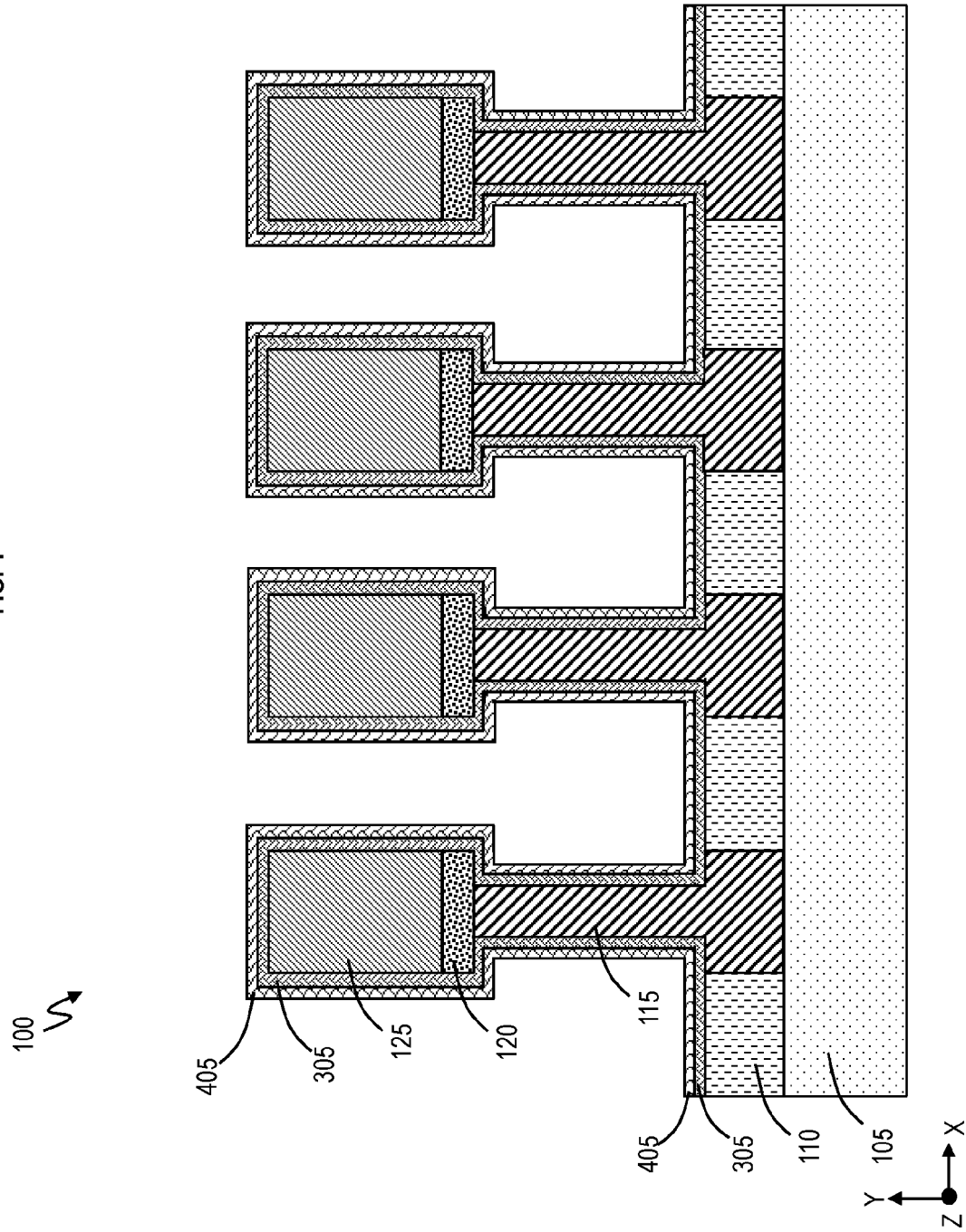
FIG. 4 is a cross-sectional view of the structure depicting deposition of a work function metal according to one or more embodiments.

FIG. 4 is a cross-sectional view of the structure 100 depicting deposition of a work function metal (WFM) 405 according to one or more embodiments. The work function metal 405 is formed on top of the high-k dielectric material 305. Accordingly, the work function metal 405 is deposited over the high-k dielectric material 305 to be on the bottom spacer 110, the fins 115 (including the indentions/recess 210), the first hard mask 120, and the second hard mask 125. The work function metal 405 is the next part of the gate stack 610. An example material of the work function metal may be titanium nitride (TiN).

Figure 5:
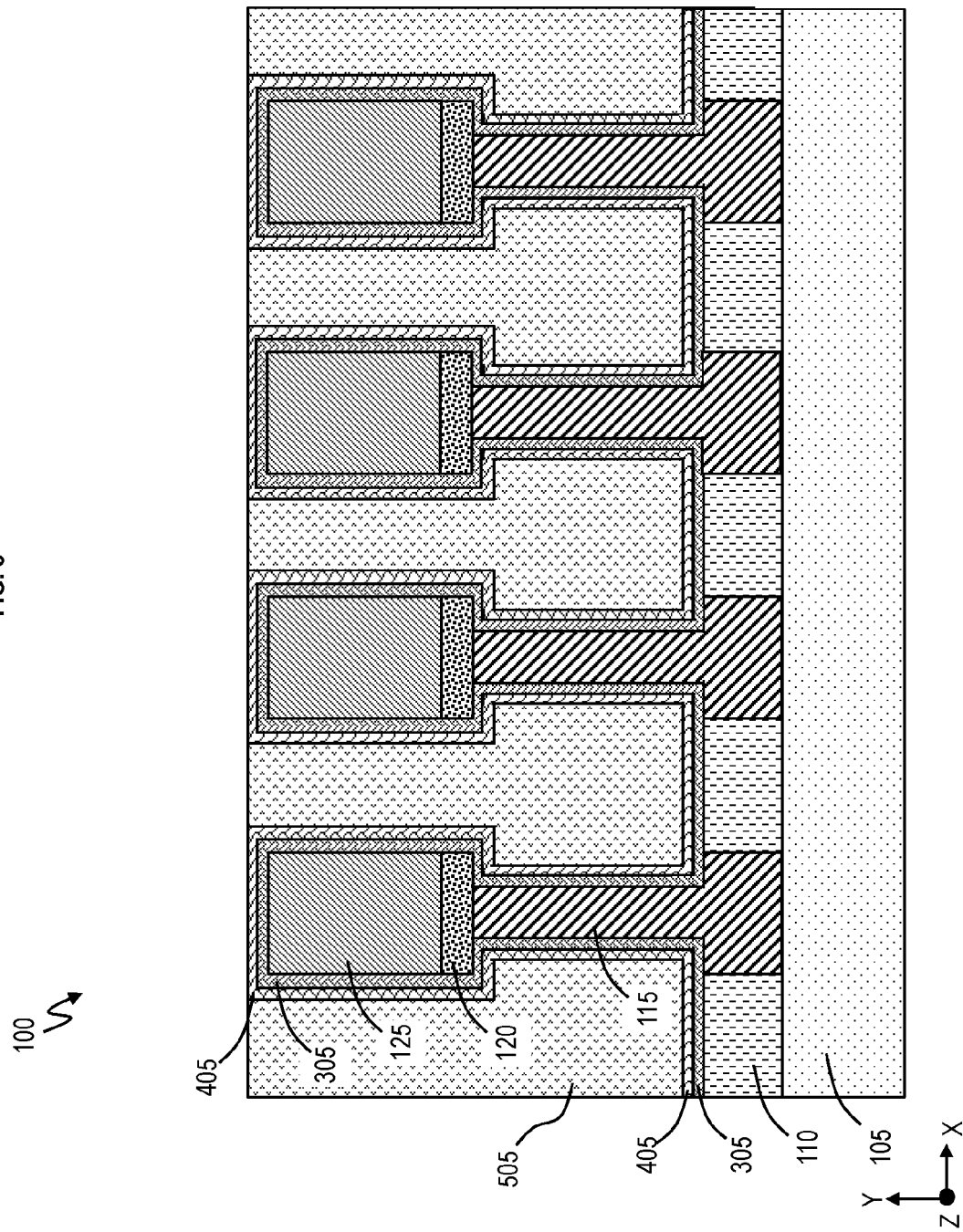
FIG. 5 is a cross-sectional view of the structure depicting deposition of a metal gate according to one or more embodiments.

FIG. 5 is a cross-sectional view of the structure 100 depicting deposition of a metal gate 505 according to one or more embodiments. The metal gate 505 is deposited on top of the work function metal 405. An example material of the metal gate 505 may include tungsten (W).

Accordingly, the metal gate 505 is deposited over the work function metal 405 to be on the bottom spacer 110, the fins 115 (including the indentions/recess 210), the first hard mask 120, the second hard mask 125. The work function metal 405 is the next part of the gate stack 610. The top surface of the structure 100 is planarized, for example, by chemical mechanical polishing/planarization (CMP).

Figure 6:
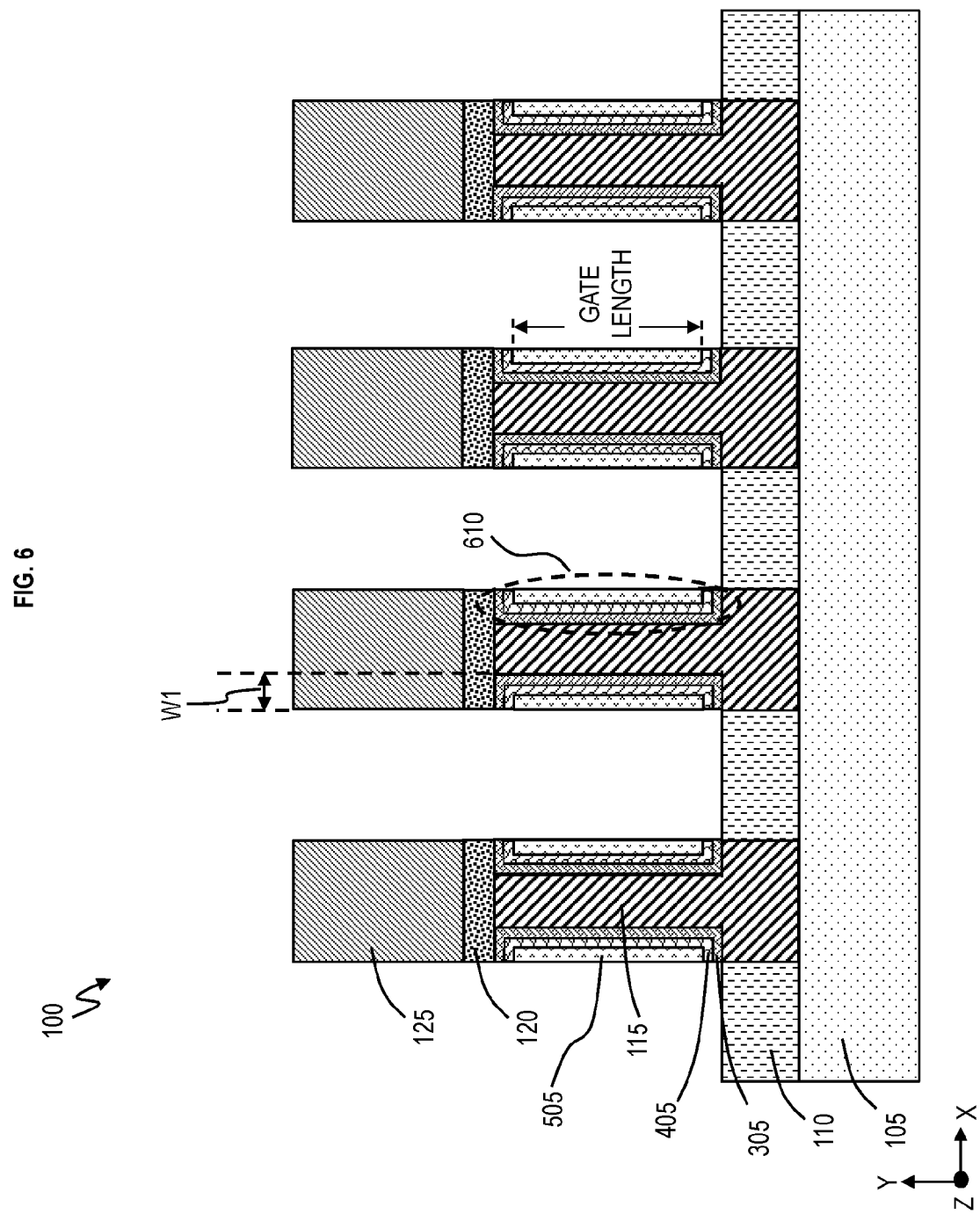
FIG. 6 is a cross-sectional view of the structure depicting anisotropic etching according to one or more embodiments.

FIG. 6 is a cross-sectional view of the structure 100 depicting anisotropic etching according to one or more embodiments. In FIG. 6, the metal gate 505, work function metal 405, and high-k dielectric material 305 are recessed by the anisotropic etch to be underneath the first hard mask layer 120 and/or second hard mask layer 125. Particularly, the first hard mask layer 120 and/or second hard mask layer 125 protect the gate stack 610 during the anisotropic etch. An example etchant used for the anisotropic etch may be halogen gas based plasma. In one implementation, an etchant may be utilized to etch the metal gate 505, and another etchant may be utilized to recess the work function metal 405 and high-k dielectric material 305.

The anisotropic etch is a gate stack recess. After the etching, the gate stack 610 has a width W1 corresponding to the depth/width of the indention/recess 210 on one side of the fin 115. The thickness of the gate stack 610 was predefined by the width W1 of the indention/recess 210.

The gate length L is defined by the height of the metal gate 505. The thickness of the deposition of the layers 305, 405, 505 comprising the gate stack 610 are controlled and predefined in advance. Also, the height H1 of the indention/recess 210 is controlled and predefined in advance. Therefore, the gate length definition (i.e., gate length) of the gate stack 610 is precisely controlled by a single etching process of the indention/recess 210 in the fins 115, because the deposition thickness of each layer 305, 405, 505.

Figure 7:
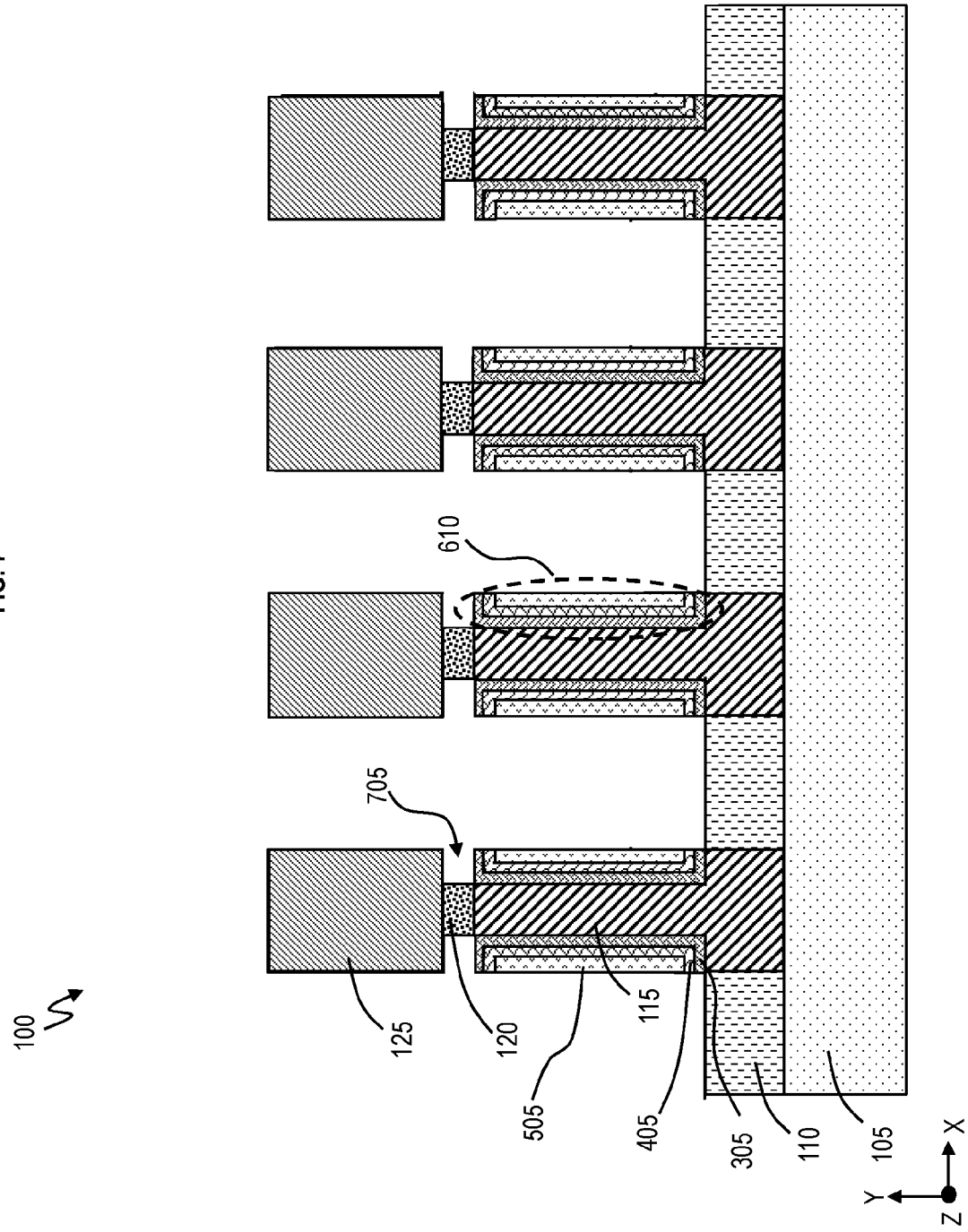
FIG. 7 is a cross-sectional view of the structure depicting etching the first hard mask layer according to one or more embodiments.

FIG. 7 is a cross-sectional view of the structure 100 depicting etching the first hard mask layer according to one or more embodiments. The first hard mask layer 120 is laterally recessed in the x-axis to have a width equal to the width of the fin 115. Laterally recessing the first hard mask layer 120 forms gaps 705. Each gap 705 has the second hard mask layer 125 above and the gate stack 610 below. Particularly, the high-k dielectric material 305 is below the gap 705. Accordingly, the recessed first hard mask layer 120 now sits (only) on the top surface of the fin 115. It should be appreciated that the gate stack 610 is being isolated from the top source/drain (not formed). The first and second hard mask layers will be removed, in order to later grow the top epitaxial layer on the fin.

A wet or isotropic etch may be utilized to recess the first hard mask layer 120. An example etchant to recess the first hard mask layer 120 may be hydrofluoric acid bath.

Figure 8:
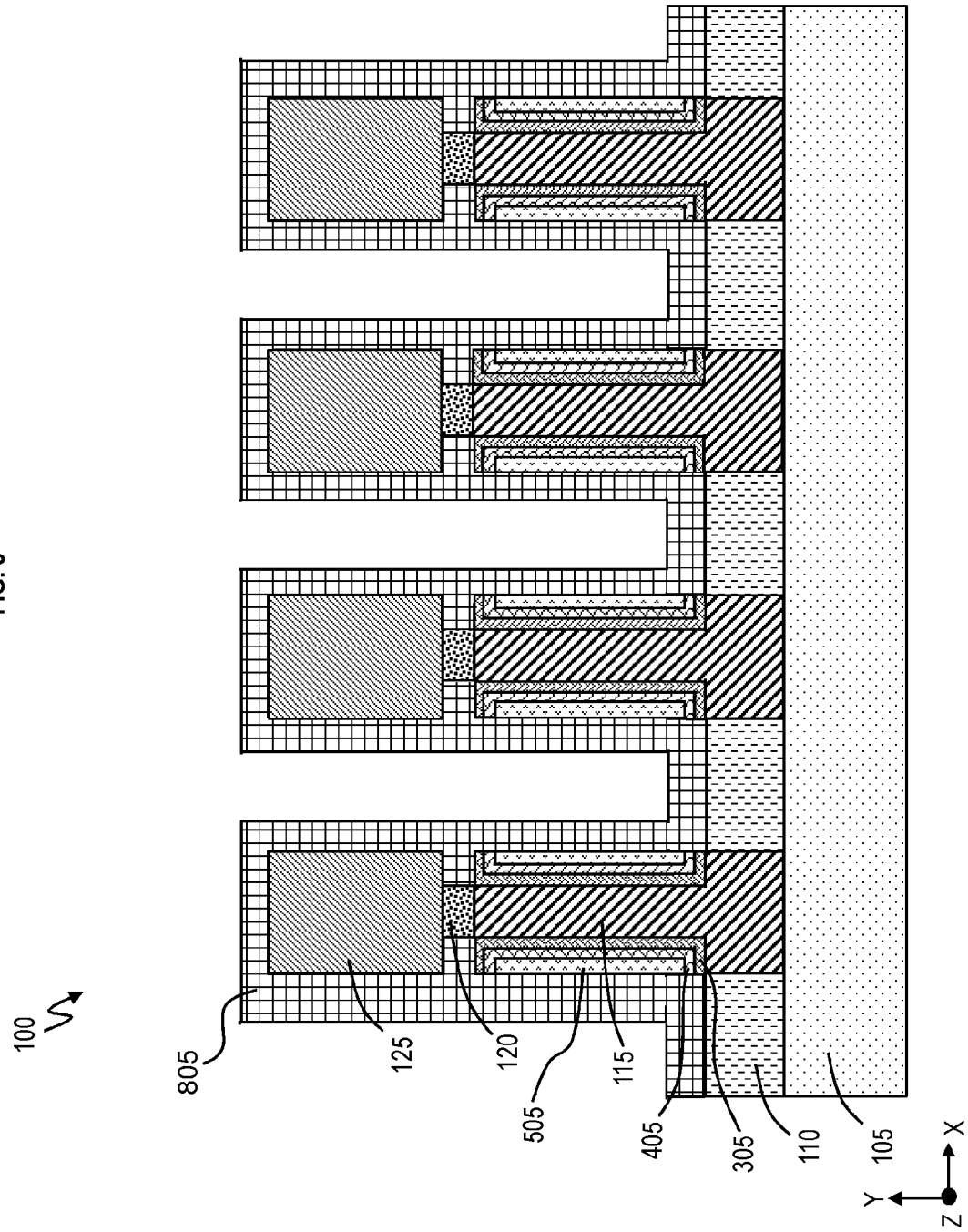
FIG. 8 is a cross-sectional view of the structure depicting spacer deposition according to one or more embodiments.

FIG. 8 is a cross-sectional view of the structure 100 depicting spacer deposition according to one or more embodiments. A spacer layer 805 is conformally deposited on the structure 100. The spacer layer 805 fills in the gap 705 and encapsulates the gate stack 610. As discussed herein, the gate stack 610 has been formed. The remaining processes for a vertical finFET may continue as understood by one skilled in the art.

FIG. 9 is flow chart 900 of a method of forming a gate stack 610 for a semiconductor device 100 according to one or more embodiments. Reference can be made to FIGS. 1-8.

At block 905, a vertical fin 115 is formed on a substrate 105, and the vertical fin 115 having an upper portion 250 and a bottom portion 260, where the upper portion 250 of the vertical fin 115 has a recessed portion 210 (also referred to as an indention) on sides of the upper portion 250.

At block 910, a gate stack 610 is formed in the recessed portion of the upper portion 250 of the vertical fin 115.

A bottom spacer 110 is formed on top of the substrate 105 and on a bottom portion 260 of the vertical fin 115.

A first hard mask layer 120 is formed on top of the vertical fin 115, such that the gate stack 610 is covered by the first hard mask layer 120. A second hard mask layer 125 is formed on top of the first hard mask layer 120.

A combined width of the upper portion 250 of the vertical fin 115 and the gate stack 610 are about a same as a width of the second hard mask layer 125. The first hard mask layer 120 has a width about a same as the upper portion 250 of the vertical fin 115. The first and second hard mask layer 120, 125 are different materials. A spacer layer 805 is formed on the vertical fin 115, the gate stack 610, the first hard mask layer 120, and the second hard mask layer 125. The first hard mask layer 120 includes an oxide material, and the second hard mask layer 125 includes a nitride material.

A method of forming a gate stack 610 for a semiconductor device 100 is provided. The method includes forming a vertical fin 115 on a substrate 105, the vertical fin 115 having an upper portion 250 and a bottom portion 260, forming a recessed portion in the upper portion 250 of the vertical fin 115 such that the recessed portion 210 is on sides of the upper portion 250, and forming a gate stack 610 in the recessed portion 210 of the upper portion of the vertical fin, wherein a gate length L is predefined by the recess portion 210.

Technical effects and benefits include improved semiconductor devices, including, for example, improved vertical transport field effect transistors (FET) with precise gate length. Technical benefits provide a novel structure and method that address the issue of timed-recess variation difference by utilizing a fin undercut, and the resulting hard mask overhang, to strictly define the gate height. The fin undercut causes an indention which is a laterally recessed portion in the fin. This allows the width of the gate, as well as the gate length, to be defined by one process (i.e., fin undercut that creates the indention) in the one or more embodiments It should be appreciated that the design for semiconductor devices may be included in or utilize features of an integrated circuit layout. An integrated circuit (IC) layout is also known as an IC layout, IC mask layout, or mask design. The integrated circuit layout is the representation of an integrated circuit in terms of planar geometric shapes which correspond to the patterns of metal, oxide, semiconductor layers, etc., that make up the components of the integrated circuit. Such an integrated circuit layout, including the layout of a semiconductor device, may be stored in a computer readable medium in preparation for fabrication as understood by one skilled in the art.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a gate stack for a semiconductor device, the method comprising:
    forming a vertical fin on a substrate, the vertical fin having an upper portion and a bottom portion, wherein the upper portion of the vertical fin has a recessed portion on sides of the upper portion; and
    forming the gate stack in the recessed portion of the upper portion of the vertical fin, such that the gate stack is on the sides of the upper portion but not above the upper portion of the vertical fin.

2. The method of claim 1, further comprising forming a bottom spacer on top of the substrate and on the bottom portion of the vertical fin.

3. The method of claim 1, wherein a first hard mask layer is formed on top of the vertical fin, such that the gate stack is covered by the first hard mask layer.

4. The method of claim 3, wherein a second hard mask layer is formed on top of the first hard mask layer.

5. The method of claim 4, wherein a combined width of the upper portion of the vertical fin and the gate stack are about a same as a width of the second hard mask layer.

6. The method of claim 3, wherein the first hard mask layer has a width about a same as the upper portion of the vertical fin.

7. The method of claim 4, wherein the first and second hard mask layers are different materials.

8. The method of claim 4, wherein a spacer layer is formed on the vertical fin, the gate stack, the first hard mask layer, and a second hard mask layer.

9. The method of claim 4, wherein the first hard mask layer includes an oxide material, and the second hard mask layer includes a nitride material.

10. A method of forming a gate stack for a semiconductor device, the method comprising:
    forming a vertical fin on a substrate, the vertical fin having an upper portion and a bottom portion;
    forming a recessed portion in the upper portion of the vertical fin such that the recessed portion is on sides of the upper portion; and
    forming the gate stack in the recessed portion of the upper portion of the vertical fin, such that the gate stack is on the sides of the upper portion but not above the upper portion of the vertical fin, wherein a gate length is predefined by the recessed portion.

* * * * *